US007725803B1

(12) United States Patent
Tang et al.

(10) Patent No.: US 7,725,803 B1
(45) Date of Patent: May 25, 2010

(54) PROGRAMMABLE LOGIC DEVICE PROGRAMMING VERIFICATION SYSTEMS AND METHODS

(75) Inventors: Howard Tang, San Jose, CA (US); Roger Spinti, Milpitas, CA (US); San-Ta Kow, San Jose, CA (US); Ann Wu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 868 days.

(21) Appl. No.: 11/557,808

(22) Filed: Nov. 8, 2006

(51) Int. Cl.
*H03M 13/00* (2006.01)
*G01R 31/28* (2006.01)
(52) U.S. Cl. ...................... 714/758; 714/725
(58) Field of Classification Search .............. 714/725, 714/746, 758; 365/189.07
See application file for complete search history.

(56) References Cited

U.S. PATENT DOCUMENTS

| 6,237,124 | B1 | 5/2001 | Plants |
| 6,363,019 | B1* | 3/2002 | Erickson et al. ........ 365/189.07 |
| 7,030,647 | B1* | 4/2006 | White et al. .................. 326/38 |
| 7,036,059 | B1 | 4/2006 | Carmichael |
| 7,257,750 | B1* | 8/2007 | Singh et al. ................. 714/732 |
| 7,647,537 | B2* | 1/2010 | Miyake et al. .............. 714/725 |

OTHER PUBLICATIONS

Xilinx Corporation, Virtex-5 FPGA Configuration User Guide, Jul. 31, 2006, 152 pages.
Altera Corporation, Stratix II Device Handbook, vol. 1, Chapter 3, Configuration & Testing, IEE Std. 1149.1 JTAG Boundary-Scan Support, Apr. 2006, 14 pages.
Altera Corporation, Error Detection & Recovery Using CRC in Altera FPGA Devices, Application Note 357, Apr. 2006, 13 pages.

* cited by examiner

*Primary Examiner*—Shelly A Chase
(74) *Attorney, Agent, or Firm*—Haynes and Boone, LLP

(57) ABSTRACT

In accordance with an embodiment of the present invention, a programmable logic device includes configuration memory to store configuration data to configure the programmable logic device, and a non-volatile memory to store configuration data for transfer to the configuration memory to configure the programmable logic device. The non-volatile memory also stores a first code value based on the configuration data stored in the non-volatile memory. A code block calculates a second code value based on the configuration data transferred to the configuration memory. A comparator compares the first code value to the second code value to verify that the configuration data was not corrupted during the transfer from the non-volatile memory to the configuration memory.

13 Claims, 3 Drawing Sheets

PROGRAMMABLE LOGIC DEVICE PROGRAMMING VERIFICATION SYSTEMS AND METHODS

TECHNICAL FIELD

The present invention relates generally to electrical circuits and, more particularly, to programming verification techniques for programmable logic devices.

BACKGROUND

Programmable logic devices, such as a complex programmable logic device (CPLD) or a field programmable gate array (FPGA), may utilize a combination of non-volatile and volatile memory to deliver a single-chip solution supporting rapid start-up (often referred to as "instant-on" capability) and infinite re-configurability. The non-volatile memory (e.g., flash memory cells) within the non-volatile PLD stores the device configuration, with the PLD configured upon power-up by transferring the configuration data from the non-volatile memory to the volatile memory (e.g., configuration SRAM cells).

During the configuration data transfer from non-volatile to volatile memory, however, it is possible for the configuration data to be corrupted. If the configuration data is corrupted, the PLD may not function properly and device contention or damage may occur to the PLD or to external devices controlled by the PLD.

A conventional approach uses software to read out from the PLD the configuration data from the volatile memory to compare to the intended bit pattern to confirm that the programming was successful. This approach is time consuming and costly, for example, in terms of the software and on-board microprocessor that may be required to perform the verification. As a result, there is a need for improved programming verification techniques for non-volatile PLDs.

SUMMARY

In accordance with one embodiment of the present invention, a programmable logic device includes configuration memory adapted to store configuration data to configure the programmable logic device; a non-volatile memory adapted to store configuration data for transfer to the configuration memory to configure the programmable logic device, wherein the non-volatile memory is further adapted to store a first code value based on the configuration data stored in the non-volatile memory; a code block adapted to calculate a second code value based on the configuration data transferred to the configuration memory; and a comparator adapted to compare the first code value to the second code value to verify that the configuration data was not corrupted during the transfer from the non-volatile memory to the configuration memory.

In accordance with another embodiment of the present invention, a programmable logic device includes configuration memory adapted to store configuration data to configure the programmable logic device; a non-volatile memory adapted to store configuration data for transfer to the configuration memory to configure the programmable logic device; and means for verifying the configuration data transferred from the non-volatile memory to the configuration memory is not corrupted.

In accordance with another embodiment of the present invention, a method of verifying a programming operation of a programmable logic device includes transferring configuration data from non-volatile memory within the programmable logic device to configuration memory to configure the programmable logic device; generating a code value based on the configuration data transferred from the non-volatile memory to the configuration memory; and comparing the generated code value to a pre-calculated code value to determine if the transferred configuration data stored in the configuration memory is corrupted.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
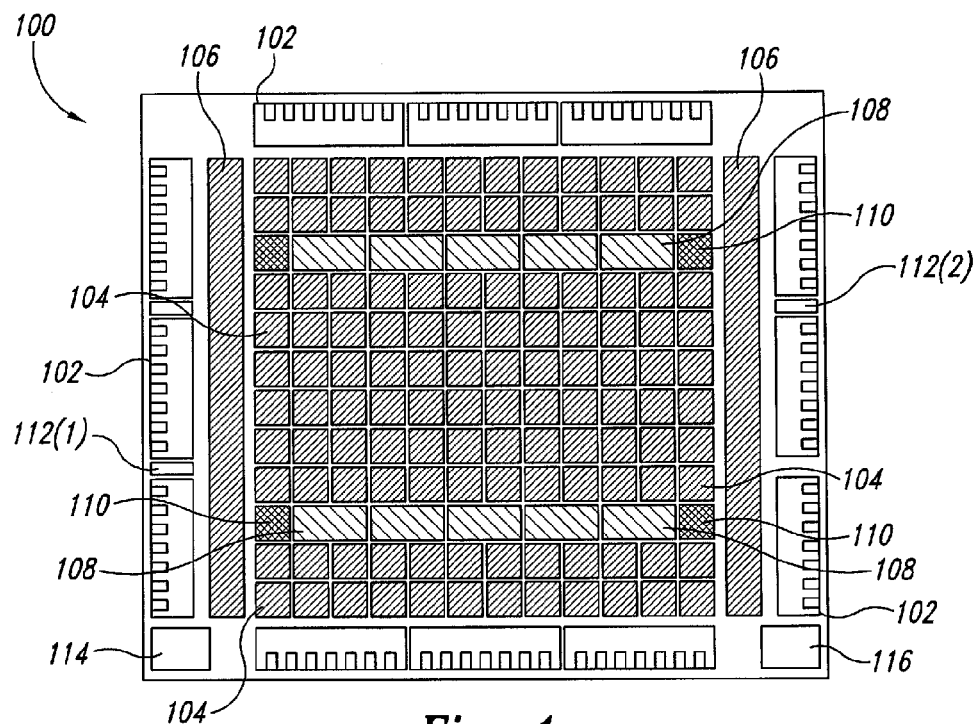
FIG. 1 shows a block diagram illustrating an example of a programmable logic device in accordance with an embodiment of the present invention.

FIG. 1 shows a block diagram illustrating an example of a programmable logic device (PLD) 100 in accordance with an embodiment of the present invention. PLD 100 generally includes input/output (I/O) blocks 102, programmable logic blocks 104, and an interconnect 116. I/O blocks 102 provide I/O functionality (e.g., supports one or more I/O and/or memory interface standards) for PLD 100. Programmable logic blocks 104 (e.g., also referred to in the art as configurable logic blocks or logic array blocks) provide logic functionality for PLD 100, such as LUT-based logic typically associated with FPGAs or array-based logic typically associated with CPLDs. Interconnect 116 would typically be distributed throughout PLD 100 to provide programmable routing resources.

PLD 100 also includes reprogrammable non-volatile memory 106 (e.g., blocks of EEPROM or flash memory) and configuration memory 114 (e.g., SRAM cells or other volatile or non-volatile memory) and may further include volatile memory 108 (e.g., block SRAM), clock-related circuitry 110 (e.g., PLL circuits), and/or one or more data ports 112. Non-volatile memory 106, for example in accordance with an embodiment of the present invention, may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Data port 112 may be used for programming PLD 100, as would be understood by one skilled in the art. For example, data port 112(1) may represent a programming port such as a central processing unit (CPU) port (also referred to as a peripheral data port, a microprocessor interface, or a sysCONFIG programming port) and/or a serial peripheral interface (SPI) port. Data port 112(2) may represent, for example, a programming port such as a joint test action group (JTAG) port by employing standards such as Institute of Electrical and Electronics Engineers (IEEE) 1149.1 or 1532 standards.

Data ports 112(1) and 112(2) are not both required, but one or the other or both may be included to receive configuration data and commands, depending upon the desired application and requirements as would be understood by one skilled in the art. Further details regarding programming examples via data ports may be found in U.S. Pat. Nos. 6,828,823 and 7,081,771.

It should be understood that the number and placement of the various elements (some of which may be optional), such as I/O blocks 102, logic blocks 104, non-volatile memory 106, volatile memory 108, clock-related circuitry 110, data port 112, configuration memory 114, and interconnect 116 is not limiting and may depend upon the desired application. Furthermore, it should be understood that the elements are illustrated in block form for clarity and that certain elements, such as configuration memory 114 and interconnect 116 would typically be distributed throughout PLD 100 (e.g., in and between logic blocks 104) to perform their conventional functions (e.g., storing configuration data that configures PLD 100 and providing programmable routing resources, respectively).

As noted herein, non-volatile memory 106 may be used to store configuration data within PLD 100 for transfer to configuration memory 114 of PLD 100 upon power up or during reconfiguration of PLD 100. After the configuration data is transferred from non-volatile memory 106 to configuration memory 114, PLD 100 wakes up and enters a user mode of operation based on the configuration data. To verify that the configuration data within configuration memory 114 has not been corrupted during the data transfer from non-volatile memory 106, a self-error detection (SED) operation is performed in accordance with one or more embodiments of the present invention.

The SED operation (also referred to herein as a one-shot SED for some embodiments) may allow PLD 100 to still provide the "instant-on" start-up capability if the SED operation is performed, for example, after PLD 100 wakes up and enters the user mode. If the SED operation detects an error in the configuration data stored in configuration memory 114, an error signal may be provided and/or other operations may be initiated (e.g., a reconfiguration may be performed by reloading the configuration data into configuration memory 114).

Figure 2:
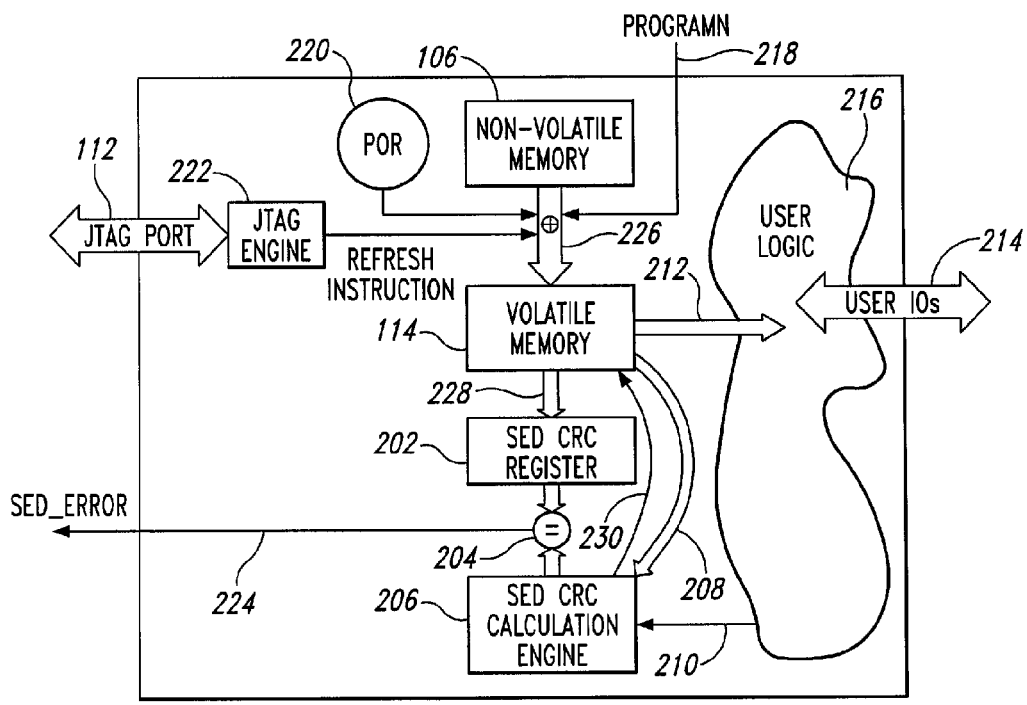
FIG. 2 shows a block diagram illustrating an example of a programmable logic device in accordance with an embodiment of the present invention.

For example, FIG. 2 shows a block diagram illustrating an example of a PLD 200 in accordance with an embodiment of the present invention. PLD 200 may represent, for example, an exemplary implementation of certain portions of PLD 100 (FIG. 1). PLD 200 includes non-volatile memory 106 and configuration memory 114 (volatile memory), with an arrow 226 indicating that configuration data stored in non-volatile memory 106 may be transferred to configuration memory 114 to configure user logic 216 within PLD 200 (as indicated by an arrow 212).

User logic 216 may represent, for example, I/O blocks 102, programmable logic blocks 104, and/or interconnect 116 (discussed in reference to FIG. 1). An arrow 214 illustrates that data (user I/O data) may be transferred to and from PLD 200 via user logic 216, such as via I/O blocks 102.

The transfer of configuration data from non-volatile memory 106 to configuration memory 114 may be initiated by various techniques, one or more of which may be optionally implemented depending upon the desired application. For example, data port 112 (e.g., a JTAG port) may be implemented to provide a command (e.g., a Refresh instruction) via a JTAG engine 222, a program pin 218 (labeled PROGRAMN) may be implemented to provide a control signal (e.g., a pulse or pin toggled), and/or a power on reset (POR) 220 may be implemented to provide a reset signal to command the transfer of the configuration data.

In accordance with an embodiment of the present invention, the configuration data programmed into non-volatile memory 106 includes a first code value such as a pre-calculated cyclic redundancy code (CRC) value (e.g., a 32-bit CRC value, also referred to as a CRC checksum) for the configuration data. For example when the configuration data is transferred from non-volatile memory 106 to configuration memory 114, the pre-calculated CRC value is stored in a register 202 (e.g., a 32-bit SED CRC register to store the 32-bit value), as illustrated by an arrow 228. A code block such as a CRC block 206 (e.g., including a CRC calculation engine for performing the SED operation) calculates a second code value such as a CRC value based on the configuration data stored in configuration memory 114. A comparator 204 (e.g., which may be any suitable structure separate from or within register 202, CRC block 206, or other elements of PLD 200 or suitable software implementation) then compares this calculated CRC value with the CRC value stored in register 202. If there is a difference between the two CRC values, an error signal 224 (labeled SED_ERROR) may be provided with a logical value (e.g., a logical high value) to indicate that the configuration data transferred to configuration memory 114 is corrupted.

For example, the SED operation may be performed automatically when the configuration data is transferred from non-volatile memory 106 to configuration memory 114. Alternatively, the SED operation may be enabled via an enable signal 210 provided, for example, by user logic 216 (e.g., user logic 216 provides a logical high enable signal 210 to CRC block 206). The SED operation, for example, may be performed only once (one-time self check) when PLD 200 enters the user mode after the transfer of the configuration data from non-volatile memory 106 to configuration memory 114. Alternatively, the SED operation may be performed periodically during the user mode of operation to check for configuration data corruption due to single-event upsets or other configuration data value disturbances.

As a specific implementation example in accordance with an embodiment of the present invention, CRC block 206 may include a CRC calculation engine that provides one or more control signals 230 to configuration memory 114 (e.g., to the associated data shift register as would be understood by one skilled in the art) to clock out the configuration data (e.g., each SRAM bit). The configuration data read from configuration memory 114 is provided to CRC block 206 (e.g., as illustrated by an arrow 208), which for example is passed sequentially through a 32-bit CRC accumulation register.

Once the configuration data (e.g., the whole array of SRAM bits) from configuration memory 114 is accumulated, the accumulated CRC value (i.e., the calculated CRC value) is compared (e.g., by comparator 204) to the pre-calculated CRC value stored in register 202. If the two CRC values do not match, error signal 224 (i.e., an error flag) is set to a certain logical value to indicate an SED error condition and that a configuration data transfer error occurred. If the two CRC values match, error signal 224 is not set (i.e., no error condition is flagged), which indicates that the configuration data transfer from non-volatile memory 106 to configuration memory 114 was successful.

Figure 3:
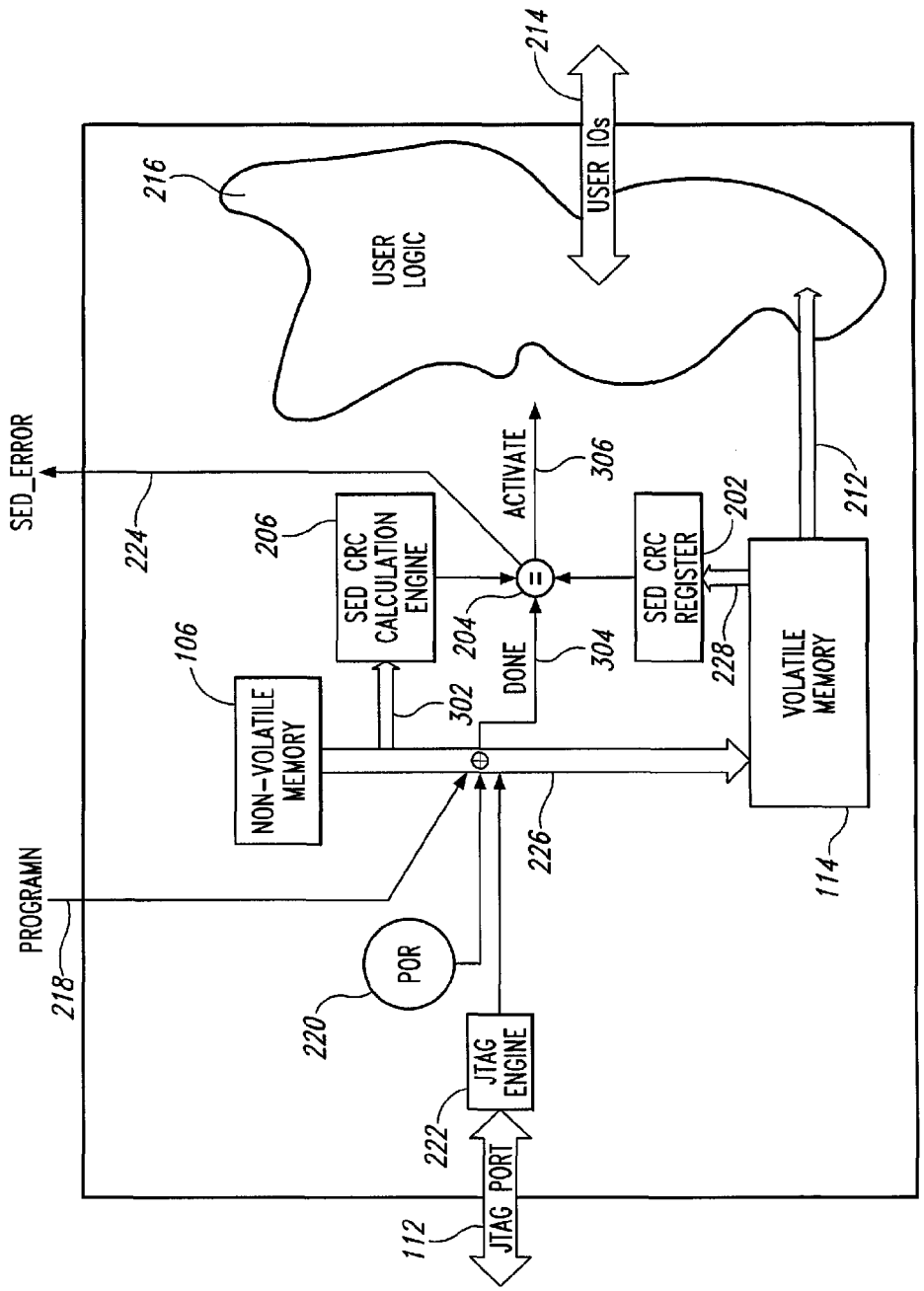
FIG. 3 shows a block diagram illustrating an example of a programmable logic device in accordance with an embodiment of the present invention.

As another example, FIG. 3 shows a block diagram illustrating an example of a PLD 300 in accordance with an embodiment of the present invention. PLD 300 may represent, for example, an exemplary implementation of certain portions of PLD 100 (FIG. 1) and is similar to PLD 200 (FIG. 2) and therefore the description of common elements will not be repeated.

PLD 300 represents an implementation example for the SED operation, with the SED operation performed automatically during the transfer of the configuration data from non-volatile memory 106 to configuration memory 114 (indicated by arrow 226). The transfer of configuration data may be initiated, as discussed in reference to FIG. 2, for example by JTAG command, POR control signal, or PROGRAMN control signal.

An arrow 302 indicates that CRC block 206 may be provided with the configuration data during the transfer of the configuration data to configuration memory 114, with CRC block 206 calculating the second code value (e.g., calculated CRC value) during the transfer. Alternatively, the configuration data may be read from configuration memory 114, as discussed in reference to FIG. 2, and provided to CRC block 206 to calculate the second code value.

A control signal 304 (e.g., labeled DONE) may be provided by a program engine (e.g., a conventional circuit block for controlling the transfer of configuration data from non-volatile memory 106 to configuration memory 114) or from CRC block 206 to indicate to comparator 204 when the transfer is complete or the second code value has been calculated, respectively. Comparator 204 compares the first code value stored in register 202 with the second code value calculated by CRC block 206 and indicates via error signal 224 if the first code value and the second code value do not match.

A control signal 306 (e.g., labeled Activate) may be provided by comparator 204 to control whether user logic 216 enters a user mode of operation (e.g., PLD 300 wakes up) based on the configuration data stored in configuration memory 114. For example, error signal 224 and control signal 306 may be combined into one control signal, with a first logic value (e.g., a logic high) indicating that the first and second code values match and user mode of operation may begin, while a second logic value (e.g., a logic low) indicating that the first and second code values do not match and the user mode of operation should not begin. For example, if the configuration data is determined to be corrupted, the configuration data transfer from non-volatile memory 106 to configuration memory 114 should be repeated or the configuration data within non-volatile memory 106 should be reprogrammed.

The SED operation of PLD 300 may provide certain advantages. For example, if the configuration data loaded into configuration memory 114 is corrupted, it may be advantageous to prevent PLD 300 from entering a user mode of operation to avoid unpredictable behavior due to the corrupted configuration data.

Figure 4:
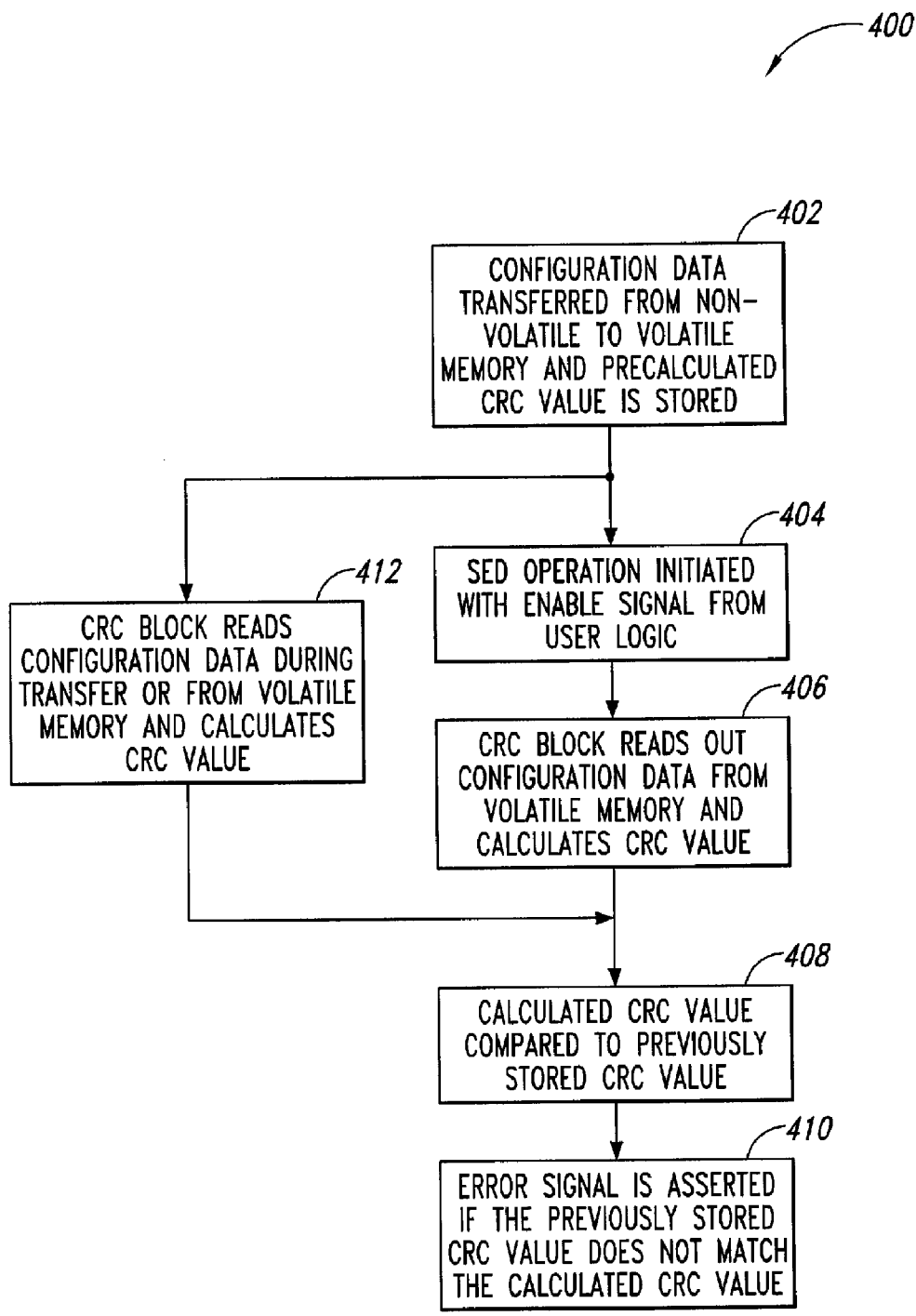
FIG. 4 shows a flowchart for program verification of the programmable logic device of FIG. 1, 2, or 3 in accordance with an embodiment of the present invention.

FIG. 4 shows a flowchart 400 as a program verification example for PLD 100, 200, or 300 (FIGS. 1, 2, and 3, respectively) in accordance with an embodiment of the present invention. Flowchart 400 begins with a transfer of configuration data from non-volatile to volatile memory, with the pre-calculated CRC value from the non-volatile memory stored in a register (block 402). Alternatively, the pre-calculated CRC value may remain in the non-volatile memory as long as it's accessible for the comparison to the calculated CRC value.

Once the PLD is configured and enters a user mode of operation, the user logic may initiate the SED operation (block 404). As an example, the SED operation option may be off by default. Therefore, a user would enable the SED operation option by setting the appropriate bit of the configuration data to appropriately configure the user logic to initiate the SED operation, if desired.

If the SED operation is enabled, the CRC block reads out the configuration data from the volatile memory and calculates a CRC value based on the configuration data (block 406). The configuration data stored in the configuration memory (e.g., SRAM configuration fuses) may be read back by the CRC block, while the PLD remains in user mode, using hardwired read back circuitry, as would be understood by one skilled in the art. Thus, the CRC block may utilize read back circuitry that may already be available on some conventional PLDs. The calculated CRC value is then compared to the previously stored (pre-calculated) CRC value (block 408) and an SED error is indicated if the two CRC values do not match (block 410).

As shown in FIG. 4 as an alternative, the CRC block may receive the configuration data during the transfer or read the configuration data from the configuration memory and calculate the CRC value (block 412). Block 412 bypasses block 404 and 406 and may be performed automatically prior to the PLD entering a user mode of operation (e.g., as discussed in reference to FIG. 3). Therefore, after the comparison is made between code values (block 408), a user mode of operation may begin if the stored CRC value and the calculated CRC value match (block 410).

Systems and methods are disclosed herein to provide programming verification techniques in accordance with one or more embodiments of the present invention. In general, conventional non-volatile PLDs typically utilize only non-volatile memory, with the configuration data stored in the non-volatile memory verified during programming (e.g., by reading out the configuration data from the PLD). As there is no configuration data transfer from non-volatile to volatile memory within the PLD, there is no risk of configuration data transfer corruption. For conventional volatile PLDs, an external boot memory device (often referred to as a boot PROM) stores the configuration data and transfers the configuration data into the PLD upon PLD power up or reconfiguration. A CRC check is typically performed on the configuration data as the PLD is reading the configuration data from the external memory, but this process (e.g., configuration and CRC check) is slow relative to the configuration time from embedded non-volatile to volatile memory.

In accordance with an embodiment of the present invention, an automatic programming verification of a PLD, with both non-volatile and volatile memory, is disclosed. The programming verification confirms whether the configuration data transfer from the non-volatile memory to the volatile memory was performed correctly and with no configuration data corruption.

Embodiments described above illustrate but do not limit the invention. It should also be understood that numerous modifications and variations are possible in accordance with the principles of the present invention. For example, although a CRC error detection routine is discussed herein, other types of error detection routines may be substituted for the CRC error detection routine in accordance with one or more embodiments of the present invention. Accordingly, the scope of the invention is defined only by the following claims.

What is claimed is:

1. A programmable logic device comprising:
   configuration memory adapted to store configuration data to configure the programmable logic device;
   a non-volatile memory adapted to store configuration data for transfer to the configuration memory to configure the programmable logic device, wherein the non-volatile memory is further adapted to store a first code value based on the configuration data stored in the non-volatile memory;
   a register adapted to store the first code value received from the non-volatile memory;
   a code block adapted to calculate a second code value based on the configuration data transferred to the configuration memory; and
   a comparator adapted to compare the first code value stored in the register to the second code value to verify that the configuration data was not corrupted during the transfer from the non-volatile memory to the configuration memory.

2. The programmable logic device of claim 1, wherein the code block comprises a cyclic redundancy code engine, the first code value comprises a pre-calculated cyclic redundancy code checksum, and the second code value comprises a cyclic redundancy code checksum.

3. The programmable logic device of claim 1, wherein the register is adapted to store the first code value received from the non-volatile memory during the transfer of the configuration data from the non-volatile memory to the configuration memory.

4. The programmable logic device of claim 1, further comprising a plurality of programmable logic blocks adapted to be configured by the configuration data stored in the configuration memory, wherein one of the programmable logic blocks provides an enable signal to the code block, based on one or more bits of the configuration data set by a user, to initiate the calculation of the second code value and the comparison of the first and second code values to verify that the configuration data was not corrupted during the transfer from the non-volatile memory to the configuration memory.

5. The programmable logic device of claim 1, wherein the comparator provides an error signal having a first logic value if the first code value does not equal the second code value, and wherein the code block provides one or more control signals to the configuration memory to read out the configuration data stored in the configuration memory.

6. A programmable logic device comprising:
   configuration memory adapted to store configuration data to configure the programmable logic device;
   a non-volatile memory adapted to store configuration data for transfer to the configuration memory to configure the programmable logic device, wherein the non-volatile memory is further adapted to store a first code value based on the configuration data stored in the non-volatile memory;
   a code block adapted to calculate a second code value based on the configuration data transferred to the configuration memory; and
   a comparator adapted to compare the first code value to the second code value to verify that the configuration data was not corrupted during the transfer from the non-volatile memory to the configuration memory,
   wherein the calculation of the second code value and the comparison of the first and second code values are performed prior to the programmable logic device entering a user mode of operation.

7. A programmable logic device comprising:
   configuration memory adapted to store configuration data to configure the programmable logic device;
   a non-volatile memory adapted to store configuration data for transfer to the configuration memory to configure the programmable logic device, wherein the non-volatile memory is further adapted to store a first code value based on the configuration data stored in the non-volatile memory;
   a code block adapted to calculate a second code value based on the configuration data transferred to the configuration memory; and
   a comparator adapted to compare the first code value to the second code value to verify that the configuration data was not corrupted during the transfer from the non-volatile memory to the configuration memory,
   wherein the calculation of the second code value and the comparison of the first and second code values, to verify that the configuration data was not corrupted during the transfer from the non-volatile memory to the configuration memory, are performed automatically after the programmable logic device enters a user mode of operation.

8. A programmable logic device comprising:
   configuration memory adapted to store configuration data to configure the programmable logic device;
   a non-volatile memory adapted to store configuration data for transfer to the configuration memory to configure the programmable logic device, wherein the non-volatile memory is further adapted to store a first code value based on the configuration data stored in the non-volatile memory;
   a code block adapted to calculate a second code value based on the configuration data transferred to the configuration memory;
   a comparator adapted to compare the first code value to the second code value to verify that the configuration data was not corrupted during the transfer from the non-volatile memory to the configuration memory;
   a plurality of programmable logic blocks;
   a volatile memory block adapted to store information during operation of the programmable logic device;
   input/output blocks adapted to transfer information into and out of the programmable logic device; and
   an interconnect configured based on the configuration data stored in the configuration memory and adapted to provide routing resources between the volatile memory block, the input/output blocks, and the programmable logic blocks.

9. A method of verifying a programming operation of a programmable logic device, the method comprising:
   transferring configuration data from non-volatile memory within the programmable logic device to configuration memory to configure the programmable logic device;
   transferring a pre-calculated code value from the non-volatile memory, wherein the pre-calculated code is based on the configuration data stored in the non-volatile memory;
   generating a code value based on the configuration data transferred from the non-volatile memory to the configuration memory; and
   comparing the generated code value to the transferred pre-calculated code value to determine if the transferred configuration data stored in the configuration memory is corrupted.

10. The method of claim 9, further comprising:
  providing an enable signal from user logic, configured based on the transferred configuration data stored in the configuration memory, to initiate the comparing;
  reading the configuration data stored in the configuration memory to provide for the generating; and
  providing an error signal if the transferred configuration data is corrupted.

11. The method of claim 9, wherein the pre-calculated code value is transferred from the non-volatile memory to a register.

12. The method of claim 9, wherein the generated code value and the pre-calculated code value are cyclic redundancy code checksums, and wherein the generated code value is generated by a cyclic redundancy code calculation engine.

13. A method of verifying a programming operation of a programmable logic device, the method comprising:
  transferring configuration data from non-volatile memory within the programmable logic device to configuration memory to configure the programmable logic device;
  reading the configuration data during the transferring;
  generating a code value based on the configuration data transferred from the non-volatile memory to the configuration memory;
  comparing the generated code value to a pre-calculated code value to determine if the transferred configuration data stored in the configuration memory is corrupted, wherein the comparing is performed prior to the programmable logic device entering a user mode of operation; and
  providing at least one error signal that indicates whether the configuration data is corrupted.

* * * * *